(12) United States Patent
Jang (10) Patent No.: US 11,087,912 B2
(45) Date of Patent: *Aug. 10, 2021

(54) MAGNETIC FIELD SHIELD SHEET FOR WIRELESS POWER TRANSMISSION AND WIRELESS POWER RECEIVING MODULE COMPRISING SAME

(71) Applicant: Amosense Co., Ltd., Cheonan-si (KR)

(72) Inventor: Kil Jae Jang, Seongnam-si (KR)

(73) Assignee: Amosense Co., Ltd., Cheonan-si (KR)

( * ) Notice: Subject to any disclaimer, the term of this patent is extended or adjusted under 35 U.S.C. 154(b) by 530 days.

This patent is subject to a terminal disclaimer.

(21) Appl. No.: 15/770,288

(22) PCT Filed: Oct. 28, 2016

(86) PCT No.: PCT/KR2016/012257
§ 371 (c)(1),
(2) Date: Apr. 23, 2018

(87) PCT Pub. No.: WO2017/074104
PCT Pub. Date: May 4, 2017

(65) Prior Publication Data
US 2018/0315534 A1    Nov. 1, 2018

(30) Foreign Application Priority Data
Oct. 30, 2015   (KR) .......................... 10-2015-0152496

(51) Int. Cl.
*H01F 10/20*    (2006.01)
*H05K 9/00*    (2006.01)
(Continued)

(52) U.S. Cl.
CPC ............. *H01F 10/20* (2013.01); *H01F 10/13* (2013.01); *H02J 7/025* (2013.01); *H02J 50/12* (2016.02);
(Continued)

(58) Field of Classification Search
None
See application file for complete search history.

(56) References Cited

U.S. PATENT DOCUMENTS 9,832,917 B2 * 11/2017 Jang .......................... H01F 1/16
9,853,487 B2 * 12/2017 Song ....................... H02J 50/10
(Continued)

FOREIGN PATENT DOCUMENTS

CN    104011814 A    8/2014
CN    104900383 A    9/2015
(Continued)

OTHER PUBLICATIONS

International Search Report dated Jan. 31, 2017 for International Application No. PCT/KR2016/012257; 4 Pages.

*Primary Examiner* — Kevin M Bernatz
(74) *Attorney, Agent, or Firm* — Daly, Crowley Mofford & Durkee, LLP (57) ABSTRACT

There is provided a magnetic field shielding sheet for wireless power transmission. The present disclosure to provide a magnetic field shielding sheet for wireless power transmission that includes a first shielding sheet for shielding a magnetic field generated from a first wireless power transmission antenna operable in a magnetic induction method, a second shielding sheet for shielding a magnetic field generated from a second wireless power transmission antenna operable in a magnetic resonance method, and a third shielding sheet which is stacked on the same surface of the first shielding sheet and the second shielding sheet so as to cover the first shielding sheet and the second shielding sheet, for shielding the magnetic field generated from the second wireless power transmission antenna.

10 Claims, 5 Drawing Sheets

(51) Int. Cl.
*H01F 10/13* (2006.01)
*H02J 50/12* (2016.01)
*H02J 50/70* (2016.01)
*H02J 7/02* (2016.01)

(52) U.S. Cl.
CPC ............ *H02J 50/70* (2016.02); *H05K 9/0007* (2013.01); *H05K 9/0075* (2013.01); *H05K 9/0088* (2013.01)

(56) References Cited

U.S. PATENT DOCUMENTS

| | | | | |
|---|---|---|---|---|
| 10,327,365 | B2* | 6/2019 | Jang | .......................... H01F 1/26 |
| 2004/0219328 | A1* | 11/2004 | Tasaki | ...................... C22C 30/00 |
| | | | | 428/692.1 |
| 2011/0044019 | A1* | 2/2011 | Hankui | ................ H05K 9/0032 |
| | | | | 361/818 |
| 2012/0062435 | A1* | 3/2012 | Kato | ......................... H01Q 7/06 |
| | | | | 343/787 |
| 2013/0202848 | A1* | 8/2013 | Kim | ....................... H01L 23/552 |
| | | | | 428/141 |
| 2014/0017486 | A1* | 1/2014 | Yoo, II | .................... B32B 27/36 |
| | | | | 428/325 |
| 2014/0320369 | A1* | 10/2014 | Azenui | .................... H01Q 7/00 |
| | | | | 343/841 |
| 2015/0115723 | A1* | 4/2015 | Levo | ........................ H01F 27/36 |
| | | | | 307/104 |
| 2015/0116178 | A1 | 4/2015 | Kim et al. | |
| 2016/0064814 | A1 | 3/2016 | Jang et al. | |
| 2017/0172020 | A1* | 6/2017 | Ye | ........................ H05K 9/0084 |
| 2019/0148988 | A1* | 5/2019 | Hwang | ................... H02J 50/10 |
| | | | | 307/104 |

FOREIGN PATENT DOCUMENTS

| | | |
|---|---|---|
| KR | 10-1163574 B1 | 7/2012 |
| KR | 10-1455729 B1 | 11/2014 |
| KR | 10-2015-0045421 A | 4/2015 |
| KR | 10-1534542 B1 | 7/2015 |
| KR | 10-1548276 B1 | 8/2015 |
| KR | 2015-0089239 A | 8/2015 |

\* cited by examiner

MAGNETIC FIELD SHIELD SHEET FOR WIRELESS POWER TRANSMISSION AND WIRELESS POWER RECEIVING MODULE COMPRISING SAME

CROSS-REFERENCE TO RELATED APPLICATION

This application is a U.S. National Stage of PCT/KR2016/012257 filed in the Korean language on Oct. 28, 2016, entitled: "Magnetic Field Shield Sheet For Wireless Power Transmission And Wireless Power Receiving Module Comprising Same" which application claims priority to Korean Application No. 10-2015-0152496 filed on Oct. 30, 2015, which applications are each hereby incorporated herein by reference in their entireties.

BACKGROUND

1. Technical Field

The present disclosure relates to a magnetic field shielding sheet for wireless power transmission and a wireless power receiving module including the same.

2. Discussion of the Related Art

Recently, various functions such as radio frequency identification (RFID), near field communication (NFC), wireless power transmission (WPT) and interactive pen tablet are added to portable terminals including mobile phones and tablet PCs.

The portable terminal has a wireless charging function for wirelessly charging a built-in battery. The wireless charging can be performed by a wireless power receiving module built in the portable terminal, and a wireless power transmitting module for supplying power to the wireless power receiving module.

In recent years, the thickness of the wireless power receiving module built in the portable terminal has been reduced as the size of the portable terminal has been reduced, and the total thickness of the wireless power receiving module has been designed to be 0.4 mm or less, or even 0.35 mm or less.

When the thickness of the wireless power receiving module is designed to be 0.4 mm or less, or even 0.35 mm or less, it is difficult to realize the characteristics required for the wireless charging function.

When the antenna unit includes a plurality of antennas serving different roles, different kinds of sheets suitable for the respective antennas are stacked to constitute a shielding unit in order to improve the performance of the antenna. Accordingly, since this stacking method has a limitation in reducing the overall thickness, a frame-type shielding sheet in which one sheet is inserted into the other is proposed.

Such the frame-type shielding sheet can reduce the overall thickness. However, it has been found that the required charging efficiency may not be satisfied in a severe condition where the total thickness of the wireless power receiving module is 0.4 mm or less.

For example, when the wireless power transmission antenna operable in a magnetic induction method and the wireless power transmission antenna operable in a magnetic resonance method are together implemented in a wireless power receiving module, the wireless power transmission antenna operable in a magnetic induction method satisfies the required charging efficiency even under severe conditions of 0.4 mm or less. However, the wireless power transmission antenna operable in a magnetic resonance method has a problem that the required charging efficiency is greatly reduced, for example, by 10% or more.

In the case of a wireless power transmission antenna operable in a magnetic induction method, even if the entire thickness of the shielding sheet is reduced, the charging efficiency is not significantly deteriorated. In the case of the wireless power transmission antenna operable in a magnetic resonance method, the charging efficiency is greatly reduced if the thickness of the shielding sheet is reduced.

Accordingly, there is a need to develop a magnetic field shielding sheet capable of satisfying the charging efficiency required for wireless charging while meeting the demand for compact size of the portable terminal.

SUMMARY

To solve the above problems and defects, it is an object of the present disclosure to provide a magnetic field shielding sheet for wireless power transmission capable of satisfying all the charging efficiencies required in the respective wireless power transmission systems even under conditions in which the total thickness is restricted when the wireless power transmission antenna operable in a magnetic induction method and the wireless power transmission antenna operable in a magnetic resonance method are together implemented in a wireless power receiving module.

In addition, it is another object the present disclosure to provide the magnetic field receiving module capable of satisfying the requirements required for wireless charging by using the above-described magnetic field shielding sheet for wireless power transmission, even in a severe condition where the thickness is restricted.

To accomplish the above and other objects of the present disclosure, according to aspect of the present disclosure, it is an object of the present disclosure to provide a magnetic field shielding sheet for wireless power transmission that includes a first shielding sheet for shielding a magnetic field generated from a first wireless power transmission antenna operable in a magnetic induction method; a second shielding sheet for shielding a magnetic field generated from a second wireless power transmission antenna operable in a magnetic resonance method; and a third shielding sheet which is stacked on the same surface of the first shielding sheet and the second shielding sheet so as to cover the first shielding sheet and the second shielding sheet, for shielding the magnetic field generated from the second wireless power transmission antenna.

In an embodiment of the present disclosure, the third shielding sheet may be disposed so as to cover a boundary region of the first shielding sheet and the second shielding sheet and may have an area equal to an area of the first shielding sheet combined with an area of the second shielding sheet.

In an embodiment of the present disclosure, the first shielding sheet may be a ribbon sheet including at least one of an amorphous alloy and a nanocrystalline alloy, and the second and third shielding sheets may be a ferrite sheet.

In an embodiment of the present disclosure, at least one of the first shielding sheet, the second shielding sheet and the third shielding sheet may be flaked and separated into a plurality of fine pieces. Here, the plurality of fine pieces may include fine pieces having at least one side of a curved shape rather than a straight line-shape. The number of fine pieces having at least one side of the curved shape may account for 50% or more of the total number of the plurality of fine pieces.

In an embodiment of the present disclosure, when the first shielding sheet and the second shielding sheet are composed of a plurality of fine pieces by flaking, the average diameter of the fine pieces constituting the second shielding sheet may be larger than the average diameter of the fine pieces constituting the first shielding sheet.

In an embodiment of the present disclosure, the plurality of fine pieces may have irregular shapes and may be entirely or partially insulated between neighboring fine pieces.

In an embodiment of the present disclosure, the first shielding sheet may be formed by stacking multi-layered ribbon sheets including at least one of an amorphous alloy and a nanocrystalline alloy.

To solve the above problem and defects, it is an object of the present disclosure to provide a wireless power receiving module that includes an antenna unit comprising a first wireless power transmission antenna operable in a magnetic induction method and a second wireless power transmission antenna operable in a magnetic resonance method; and a magnetic field shielding sheet for wireless power transmission which is disposed on one surface of the antenna unit, for shielding a magnetic field generated from the antenna unit and condensing the magnetic field in a desired direction.

In an embodiment of the present disclosure, the antenna unit may include a magnetic security transmission (MST) antenna disposed at a position corresponding to the first shielding sheet together with the first wireless power transmission antenna. The antenna unit may include an NFC antenna disposed at a position corresponding to the second shielding sheet together with the second wireless power transmission antenna. The antenna unit may include the MST antenna disposed at a position corresponding to the first shielding sheet together with the first wireless power transmission antenna and the NFC antenna disposed at a position corresponding to the second shielding sheet together with the second wireless power transmission antenna.

In an embodiment of the present disclosure, the total thickness of the antenna unit and the magnetic field shielding sheet may be 0.3 mm to 0.4 mm, and the total thickness of the second shielding sheet and the third shielding sheet may be 0.2 mm.

In an embodiment of the present disclosure, the present disclosure may provide a portable terminal in which the wireless power receiving module is provided in a back cover or a rear case.

According to the present disclosure, it is possible to satisfy all of the charging efficiency required for the wireless power transmission antenna, which operates in different methods even if the overall thickness is reduced by stacking additional sheets on one surface of a shielding sheet having a frame shape.

Further, according to the present disclosure, the sheet disposed outside the plurality of sheets constituting the magnetic field shielding sheet is configured to include at least a predetermined number of fine pieces each having at least one side of cured shape, thereby securing the flexibility of the sheet itself and reducing the characteristic change.

DETAILED DESCRIPTION OF THE EMBODIMENTS

Hereinafter, exemplary embodiments of the present disclosure will be described in detail with reference to the accompanying drawings, which will be readily apparent to those skilled in the art to which the present disclosure pertains. The present disclosure may be embodied in many different forms and is not limited to the embodiments described herein. In the drawings, parts not relating to the description are omitted for clarifying the present disclosure, and the same reference numerals are assigned to the same or similar components throughout the specification.

Figure 4:
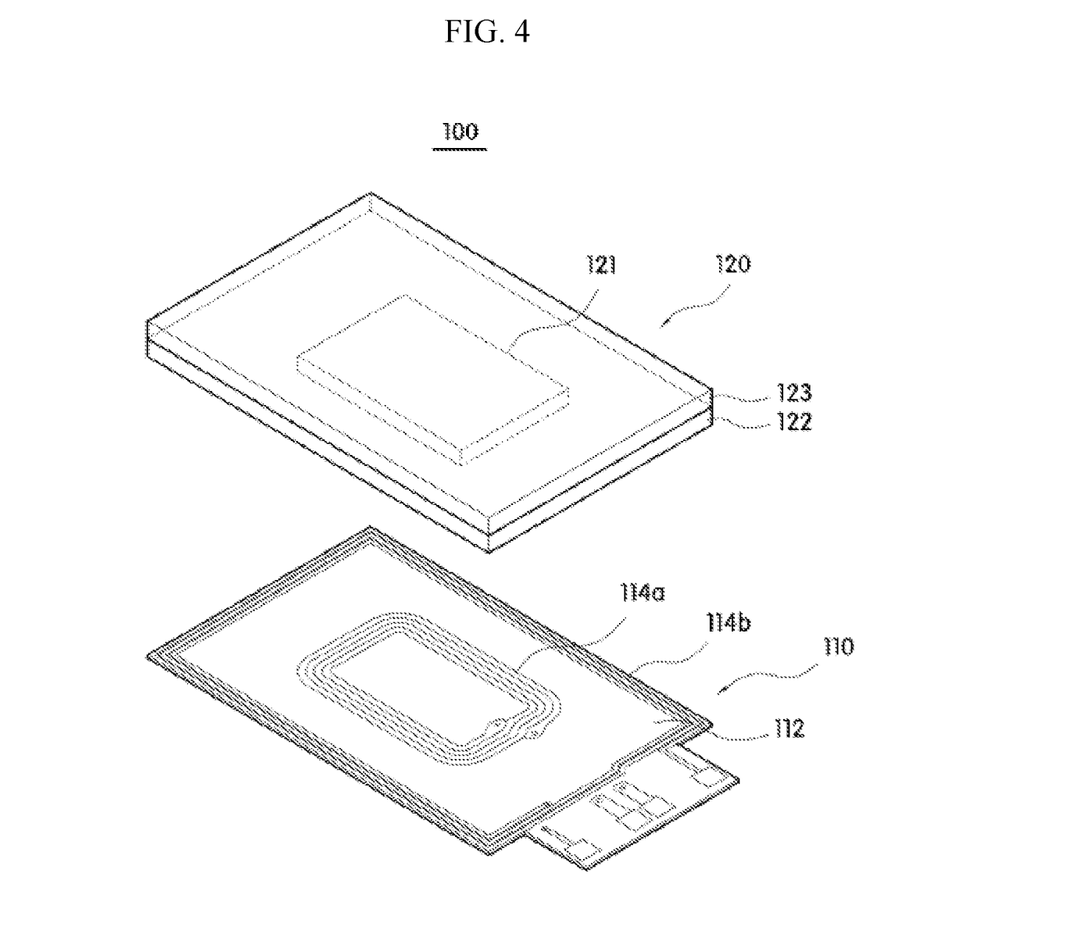
FIG. 4 illustrates a wireless power receiving module applied the magnetic field shielding sheet for wireless power transmission according to an embodiment of the present disclosure.
Figure 5:
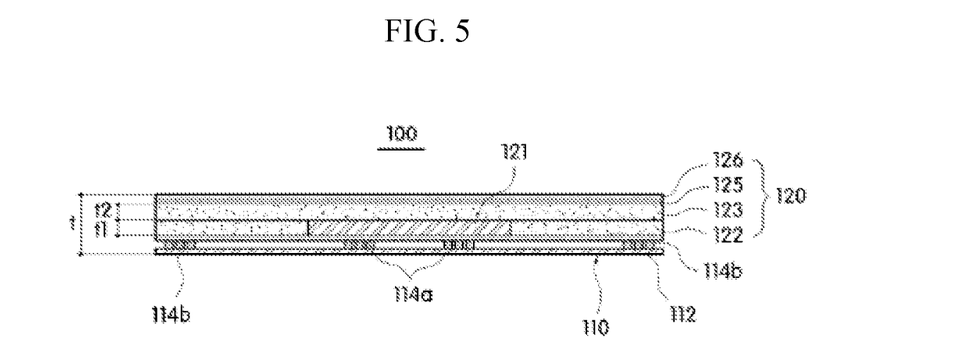
FIG. 5 is a cross-sectional view of the wireless power receiving module of FIG. 4.
Figure 6A:
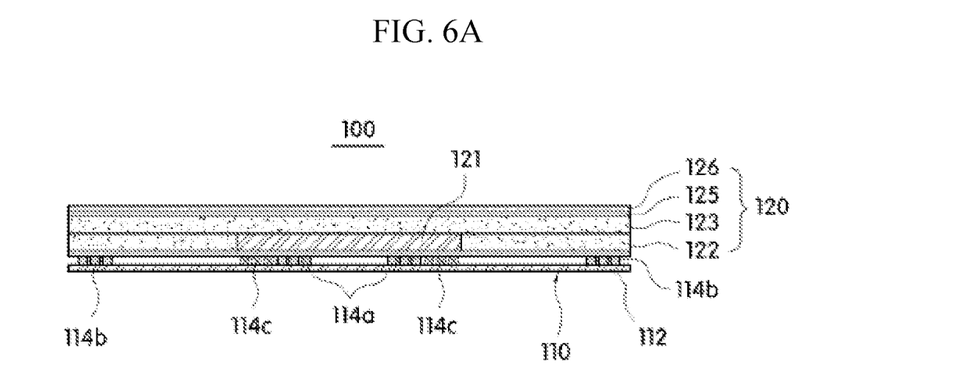
FIGS. 6A to 6C are cross-sectional views illustrating the dispositional relationships between the various antenna units and the magnetic field shielding sheets applicable to FIG. 4.
Figure 6B:
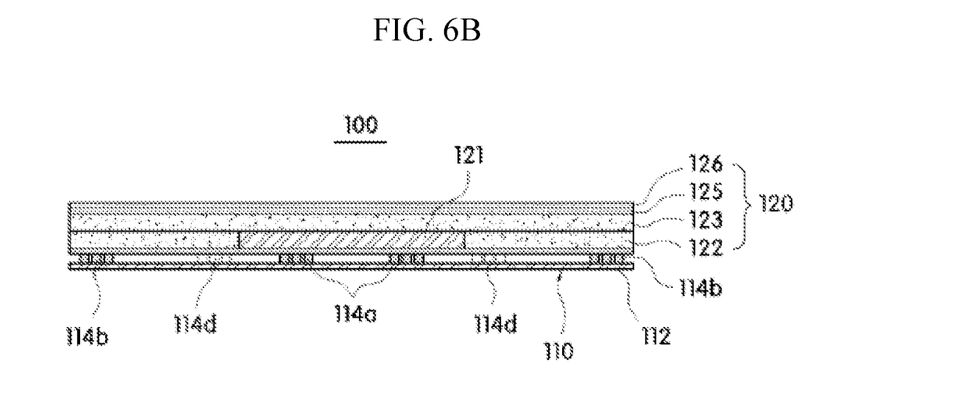
Figure 6C:
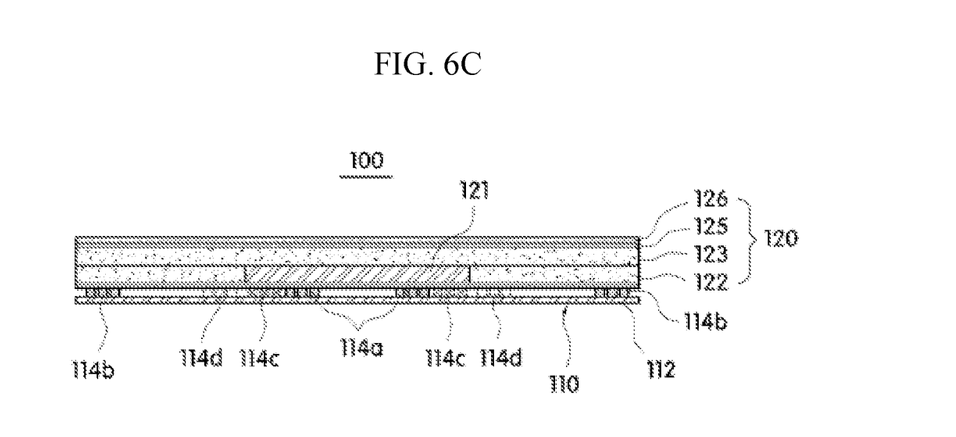

Referring to FIGS. 4 and 5, a wireless power receiving module 100 according to exemplary embodiments of the present disclosure may include an antenna unit 110 and a magnetic field shielding sheet 120.

The antenna unit 110 may be embedded in a portable electronic device such as a portable phone, a personal digital assistant (PDA), a portable multimedia player (PMP), a tablet, a multimedia device, and the like to transmit or receive wireless signal.

As an antenna unit 110 is provided with a plurality of wireless power transmission antenna 114a and 114b operating in different methods at different operating frequencies and receives wireless signal in the corresponding operating frequency band, the power needed in the above-described portable electronic device may be produced.

Here, the plurality of wireless power transmission antenna 114a and 114b may be formed of a flat coil wound in a clockwise direction or counterclockwise direction. The wound flat coil may have a circular shape, an elliptical shape, a spiral shape, or a polygonal shape such as a quadrangular shape. A surface of the radiator may be fix to the shielding unit 120. As shown in FIGS. 4 to 6C, the antenna may be a loop-shaped metal pattern which can be made by patterning a conductor such as a copper foil on at least one surface of a circuit board 112 made of synthetic resin such as polyimide (PI), polyethylene terephthalate (PET), or the like, or by using conductive ink.

The plurality of wireless power transmission antennas 114a and 114b may include a first wireless power transmission antenna 114a operable in a magnetic induction method and a second wireless power transmission antenna 114b operable in a magnetic resonance method.

That is, the first wireless power transmission antenna 114a may be a Qi or a Power Matters Alliance (PMA) standard method antenna operable in a magnetic induction method in an operating frequency band of 100 to 350 kHz. The second wireless power transmission antenna 114b may be an Alliance for Wireless Power (A4WP) standard method antenna operable in a magnetic resonance method in an operating frequency band of 6.765 to 6.795 MHz.

Accordingly, the wireless power receiving module including the antenna unit 110 in which the first wireless power transmission antenna 114a and the second wireless power transmission antenna 114b operate in a magnetic induction method and a magnetic resonance method, respectively, may use two different types of wireless power transmission methods through one receiving module.

Here, the first wireless power transmission antenna 114a operable in the magnetic induction method may be operated in both the Qi standard method and the PMA standard method via one antenna.

Accordingly, the wireless power receiving module 100 built in the portable terminal according to the present disclosure may receive wireless power or charge built in a battery, by using Qi, PMA, and A4WP which have different operating frequencies or operating methods.

Here, the plurality of antennas 114a and 114b may be patterned on the upper surface of the circuit board 112 in the drawings, but the present disclosure is not limited thereto. The plurality of antennas 114a and 114b may be patterned on the lower surface of the circuit board 112 and may be electrically connected to each other through via holes formed on the upper and lower surfaces of the circuit board 112.

The antenna unit 110 may be fixed to one surface of the magnetic field shielding sheet 120 through an adhesive layer. Here, the adhesive layer may be an adhesive bond, PVC, rubber or double-sided tape or the like, and may include a conductive component.

Meanwhile, the antenna unit 110 according to the present disclosure may further include an antenna for performing additional functions such as data transmission/reception and self-payment using the short distance data communication as well as the wireless power transmission.

That is, the antenna unit 110 may further include at least one of the near field communication (NFC) antenna 114d for the short-distance communication and the magnetic secure transmission (MST) antenna 114c for the magnetic security transmission.

For example, the antenna unit 110 may include the MST antenna 114c (refer to FIG. 6A) disposed between the first wireless power transmission antenna 114a and the second wireless power transmission antenna 114b, or the NFC antenna 114d (refer to FIG. 6B) disposed between the first wireless power transmission antenna 114a and the second wireless power transmission antenna 114b. The antenna unit 110 may include both the MST antenna 114c and the NFC antenna 114d (refer to FIG. 6C) disposed between the first wireless power transmission antenna 114a and the second wireless power transmission antenna 114b.

At this time, the NFC antenna 114d and the MST antenna 114c may be disposed so as to close to the respective antenna of the same frequency band, among the first wireless power transmission antenna 114a and the second wireless power transmission antenna 114b. That is, the NFC antenna 114d in an operating frequency of 13.56 MHz may be disposed close to the second wireless power transmission antenna 114b in an operating frequency band of 6.765 MHz to 6.795 MHz. The MST antenna 114c in an operating frequency band of 70 kHz to 80 kHz may be disposed close to the first wireless power transmission antenna 114a.

This is to increase the performance of both antennas operating in similar bands through one sheet.

For example, the first wireless power transmission antenna 114a and the MST antenna 114c may be disposed on an area corresponding to the first shielding sheet 121, respectively, which will be described later. The second wireless power transmission antenna 114b and the NFC antenna 114d may be disposed on areas corresponding to the second shielding sheet 122, respectively, which will be described later.

Here, when both the NFC antenna 114d and the first wireless power transmission antenna 114a are provided, since the operating frequency band of the NFC antenna 114d is higher than that of the first wireless power transmission antenna 114a, the NFC antenna 114d may be formed as a conductive pattern having a fine line width outside the first wireless power transmission antenna 114a. Since the first wireless power transmission antenna 114a requires power transmission and uses a lower frequency band than that of the NFC antenna 114d, the first wireless power transmission antenna 114a may be formed with the wider line width than the line width of the NFC antenna 114d, inside the NFC antenna 114d.

Figure 1:
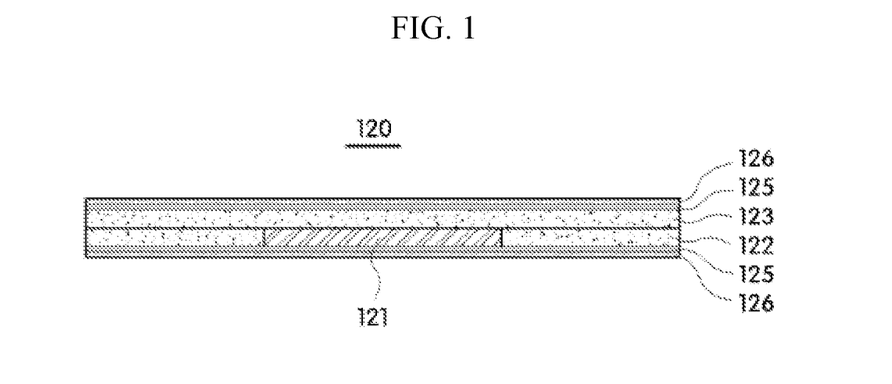
FIG. 1 is a cross-sectional view of a magnetic field shielding unit for wireless power transmission according to an embodiment of the present disclosure.
Figure 2:
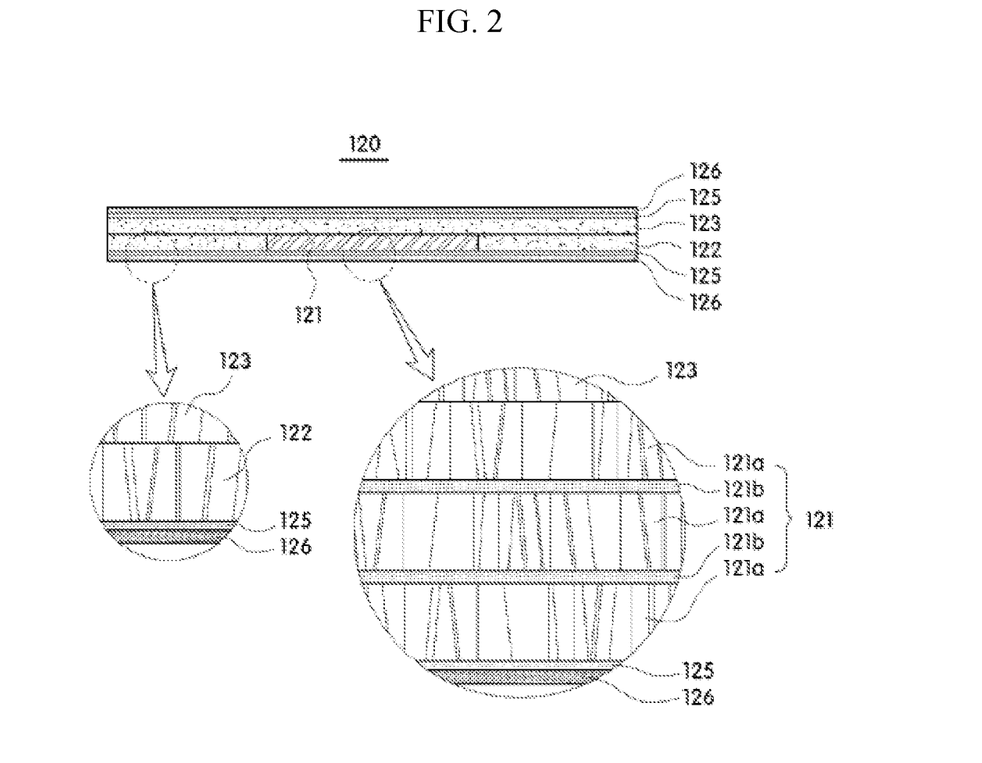
FIG. 2 is an enlarged view showing a detailed configuration of the first, the second and the third shielding sheet in FIG. 1.

As shown in FIGS. 1 and 2, the magnetic field shielding sheet 120 may be made of a plate-like member having a predetermined area. The magnetic field shielding sheet 120 may shield the magnetic field generated from the antenna unit 110 and condense the magnetic field in a desired direction.

That is, the magnetic field shielding sheet 120 may include a first shielding sheet 121, a second shielding sheet 122, and a third shielding sheet 123 to shield magnetic fields generated from the antenna operating in different frequency bands from affecting other components.

In the present disclosure, the first shielding sheet 121 may be to shield a magnetic field generated from the first wireless power transmission antenna 114a and the MST antenna 114c among the plurality of antennas. The second shielding sheet 122 may be to shield a magnetic field generated from the second wireless power transmission antenna 114b and the NFC antenna 114d among the plurality of antennas. In addition, the third shielding sheet 123 may supplement the second shielding sheet 122 and to shield the magnetic field generated from the second wireless power transmission antenna 114b and the NFC antenna 114d.

To this end, the first shielding sheet 121 may be disposed on an area corresponding to the first wireless power transmission antenna 114a. The second shielding sheet 122 may be disposed on an area corresponding to the second wireless power transmission antenna 114b. The third shielding sheet 123 may also be disposed on an area corresponding to the second wireless power transmission antenna 114b.

Here, the first shielding sheet 121 may have an area to cover an entire area of the first wireless power transmission antenna 114a disposed inside the second wireless power transmission antenna 114b. Accordingly, the entire area of the first wireless power transmission antenna 114a may be covered through the first shielding sheet 121, so that the magnetic field generated from the first wireless power transmission antenna may be completely shielded.

When the MST antenna 114c is provided in the antenna unit 110, the first shielding sheet 121 may be provided so as to cover an area directly above the first wireless power transmission antenna 114a and the MST antenna 114c. When the NFC antenna 114d is provided in the antenna unit 110, the second shielding sheet 122 and the third shielding sheet 123 may be provided so as to cover an area directly above the second wireless power transmission 114b antenna and the NFC antenna 114d. However, the dispositions of the NFC antenna 114d and the MST antenna 114c may not be limited thereto. If the first wireless power transmission antenna 114a is disposed on an area corresponding to the first shielding sheet 121, and the second wireless power transmission antenna 114b is disposed on an area corresponding to the second shielding sheet 122, the disposition of the NFC antenna 114d and the MST antenna 114c may be changed. For example, the NFC antenna 114d may be disposed on an area corresponding to the first shielding sheet 121, and the MST antenna 114c may be disposed on an area corresponding to the second shielding sheet 122.

Meanwhile, the magnetic field shielding sheet 120 according to the present disclosure may effectively shield the magnetic field generated from each antenna operating in different frequency bands, thereby improving the performance of the antenna and reducing the overall thickness.

To this end, a receiving portion for receiving the entire thickness of the first shielding sheet 121 may be formed inside the second shielding sheet 122. Accordingly, the first shielding sheet 121 may be inserted into the receiving portion. The third shielding sheet 123 may be stacked on the same surface of the first shielding sheet 121 and the second shielding sheet 122 to cover one surface of the first shielding sheet 121 and the second shielding sheet 122.

That is, a receiving portion having substantially the same size as the first shielding sheet 121 may be pass-through formed inside the second shielding sheet 122. The thickness of the second shielding sheet 122 may be substantially the same as that of the first shielding sheet 121. Accordingly, when the first shielding sheet 121 is inserted into the receiving portion of the second shielding sheet 122, the second shielding sheet 122 may receive the entire thickness of the first shielding sheet 121. A surface of the first shielding sheet 121 and the second shielding sheet 122 may form a horizontal plane.

Here, the third shielding sheet 123 may be stacked on one surface of the first shielding sheet 121 and the second shielding sheet 122 so as to cover the boundary region of the first shielding sheet 121 and the second shielding sheet 122, which are disposed with the frame type on the same surface.

In other words, as the third shielding sheet 123 is stacked on the first shielding sheet 121 and the second shielding sheet 122 so as to cover an area including a boundary line of the first shielding sheet 121 and the second shielding sheet 122, a gap formed between the first shielding sheet 121 and the second shielding sheet 122 may be covered by the third shielding sheet 123.

Here, the third shielding sheet 123 may have the same characteristics as that of the second shielding sheet 122 so as to shield the magnetic field generated from the second wireless power transmission antenna 114b and condense the sheet in a desired direction.

Accordingly, even if a part of the magnetic field generated from the second wireless power transmission antenna 114b operable in the magnetic resonance method leaks through the gap between the first shielding sheet 121 and the second shielding sheet 122, the magnetic field may be shielded through the third shielding sheet 123 disposed on the upper portion of the gap.

Therefore, even if the thickness of each of the first shielding sheet 121, the second shielding sheet 122 and the third shielding sheet 123 may be reduced in order to reduce the overall thickness of the magnetic field shielding sheet 120, the function of the second shielding sheet 122 may be supplemented by the third shielding sheet 123 during the wireless power transmission or wireless charging of the magnetic resonance method through the second wireless power transmission antenna 114b, thereby preventing the power transmission efficiency and the charging efficiency from being significantly lowered.

Accordingly, the magnetic shielding sheet 120 according to the present disclosure should satisfy the severe condition that the overall thickness of the wireless power receiving module 100 is limited to a thickness of 0.4 mm or less, or even 0.35 mm or less. Although the entire thickness of the magnetic shielding sheet 120 is thinned to a thickness of 0.2 mm in order to satisfy severe conditions, it is possible to satisfy the wireless power transmission efficiency or the wireless charging efficiency required in the first wireless power transmission antenna 114a operating in the magnetic induction method as well as the second wireless power transmission antenna 114b operating in the magnetic resonance method.

This can be seen in Table 1 below.

TABLE 1

| Charging power (W) | Reference example Charging efficiency (%) | Comparative example Charging efficiency (%) | Exemplary embodiment Charging efficiency (%) |
|---|---|---|---|
| 4 | 51.27 | 46.02 | 50.81 |
| 5 | 50.61 | 46.96 | 50.52 |

Here, the reference example may be the charging efficiency in the case where the magnetic field shielding sheet is formed with the sheet for the wireless power transmission antenna operating in the magnetic resonance method. The comparative example may be the charging efficiency in case where the magnetic field shielding sheet is formed with the frame-type in which the first shielding sheet for the wireless power transmission antenna operable in a magnetic induction method is inserted inside the second shielding sheet for the wireless power transmission antenna operable in a magnetic resonance method. The exemplary embodiment may be the charging efficiency of the magnetic field shielding sheet according to the present disclosure.

At this time, the total thickness of the magnetic field shielding sheet used in the reference example, the comparative example, and the exemplary embodiment is 0.2 mm. More specifically, the ferrite sheet having the thickness of 0.2 mm is applied as the sheet for the wireless power transmission antenna operable in a magnetic resonance method. In case of charging power of 4 W and in case of charging power of 5 W are compared.

As shown in Table 1, the charging efficiency of the magnetic field shielding sheet 120 exhibits substantially equal to the charging efficiency in the reference example which is an optimum condition of the wireless power transmission antenna operable in a magnetic resonance method. On the other hand, in the case of the comparative example in which the magnetic field shielding sheet is formed with the frame-type, the charging efficiency accounts for 90% as compared with the charging efficiency in the reference example.

This is because, in the case of the comparative example, a part of the magnetic field leaks through the gap generated between the first and the second sheets, thereby reducing the overall charging efficiency. On the other hand, in the case of the magnetic shield sheet according to the present disclosure, even if a part of the magnetic field leaks between the first and second shielding sheets, the charging efficiency is not greatly reduced by supplementing through the third shielding sheet.

The magnetic shielding sheet according to the present invention can prevent the charging efficiency of the second wireless power transmission antenna from being significantly lowered even if the total thickness is reduced as a whole Herein, although the overall thickness of the wireless power receiving module 100 is 0.4 mm, the thickness is not limited thereto and should be interpreted to mean very thin thickness.

In addition, the second shielding sheet 122 and the third shielding sheet 123 for the second wireless power transmission antenna 114b may have the same or different thicknesses. That is, when the thickness of the first shielding sheet 121 for the first wireless power transmission antenna 114a has a thickness that may satisfy the power transmission efficiency or the charging efficiency required for wireless power transmission or wireless charging through the magnetic induction method, and the second shielding sheet 122 has the same thickness as the first shielding sheet 121, the thickness of the third shielding sheet 123 may be appropriately increased or decreased within the rest permissible thickness of magnetic field shielding sheet other than the thickness of the first shielding sheet 121 or the second shielding sheet 122.

The magnetic shielding sheet 120 formed of the first shielding sheet 121, the second shielding sheet 122 and the third shielding sheet 123 may be provided with a protective film 126 attached to at least one surface of the upper and the lower surface via an adhesive layer. At this time, the adhesive layer 125 may include a non-conductive component. When at least one of the first shielding sheet 121, the second shielding sheet 122 and the third shielding sheet 133 is flaked and divided into a plurality of fine pieces, the adhesive layer 125 may be absorbed between the fine pieces and serve to insulate the fine pieces. In addition, the adhesive layer 125 may be provided as an adhesive agent or may be provided in the form of a film-like substrate and a protective film coated with an adhesive agent on one or both sides of the substrate, and may have adhesiveness.

The magnetic field shield sheet 120 according to the present disclosure may be provided such that the first shielding sheet 121 for the first wireless power transmission antenna 114a, the second shielding sheet 122 for the second wireless power transmission antenna 114b and the third shielding sheet 123 may have different permeabilities in a predetermined frequency band.

That is, the first shielding sheet 121 may be made of a material having a relatively higher permeability than that of the second shielding sheet 122 and the third shielding sheet 123 in a frequency band of 100 to 350 kHz.

For example, the first shielding sheet 121 may be a ribbon sheet including at least one of an amorphous alloy and a nanocrystalline alloy, and the second shielding sheet 122 and the third shielding sheet 123 may be a ferrite sheet.

Here, the ribbon sheet including at least one of the amorphous alloy and the nanocrystalline alloy may be a Fe-based or a Co-based magnetic alloy, the ferrite sheet may be a sintered ferrite sheet. In addition, the ferrite may be Mn—Zn ferrite or Ni—Zn ferrite.

In the present disclosure, the amorphous alloy or the nanocrystalline alloy may be refer to a metal having disordered atoms or molecules unlike ordered atoms or molecules of the crystalline alloy even having the same component with the crystalline alloy.

However, the first shielding sheet 121, the second shielding sheet 122 and the third shielding sheet 123 are not limited to the above-mentioned kind. It is possible to use any material having magnetic property so as to shield the magnetic field generated from the first wireless power transmission antenna 114a and the second wireless power transmission antenna 114b to increase wireless power transmission efficiency or wireless charging efficiency.

Meanwhile, when the first shielding sheet 121 for the first wireless power transmission antenna 114a is the ribbon sheet 121a including at least one of the amorphous alloy and the nanocrystalline alloy, as shown in FIG. 2, the ribbon sheet 121a may be flaked and divided into a plurality of fine pieces. Each fine piece may have irregular shapes. This is to increase the charging efficiency by increasing the overall resistance and suppressing the generation of the eddy current, thereby reducing the loss due to the eddy current.

In addition, when the first shielding sheet 121 is composed of the ribbon sheet 121a including at least one of the amorphous alloy and the nanocrystalline alloy, the first shielding sheet 121 may be formed by stacking a plurality of ribbon sheets 121a, which are flaked and divided into the plurality of fine pieces. At this time, the adhesive layer 121b containing a non-conductive component may be disposed between each of the ribbon sheets 121a. The adhesive layer 121b may at least partly penetrate to the side of the respective ribbon sheets 121a to be stacked to each other and may move between the fine pieces constituting the ribbon sheet 121a to insulate neighboring fine pieces. Here, the adhesive layer may be provided as an adhesive agent or provided on one side or both sides of a substrate in the form of a film in which an adhesive agent is applied.

At least one of the second shielding sheet 122 and the third shielding sheet 123 for the second wireless power transmission antenna 114b may be flaked and divided into the plurality of fine pieces. Preferably, as shown in FIG. 2, the second shielding sheet 122 and the third shielding sheet 123 may be both flaked and divided into the plurality of fine pieces. Each fine piece may have a size of 1 μm to 7 mm and irregular shapes.

This is, the second shielding sheet 122 and the third shielding sheet 123 are divided and formed into the plurality of fine pieces to ensure flexibility, so that the second shielding sheet 122 and the third shielding sheet 123 are prevented from cracking and breaking during using or transportation. Accordingly, the characteristic change of sheet itself, which is generated in cracking or breaking, may be reduced, and the charging efficiency may be enhanced by increasing the overall resistance and suppressing the generation of eddy current, Particularly, when the second shielding sheet 122 and the third shielding sheet 123 are made of the ferrite sheet having high brittleness, they are divided into a plurality of fine pieces to secure flexibility, thereby preventing or minimizing occurrence of cracks and breaking. As a result, it is possible to prevent the wireless power transmission efficiency and the charging efficiency of the second wireless power transmission antenna 114b operable in the magnetic resonance method from being significantly lowered by preventing the change of initial characteristic due to cracking and breaking.

Figure 3:
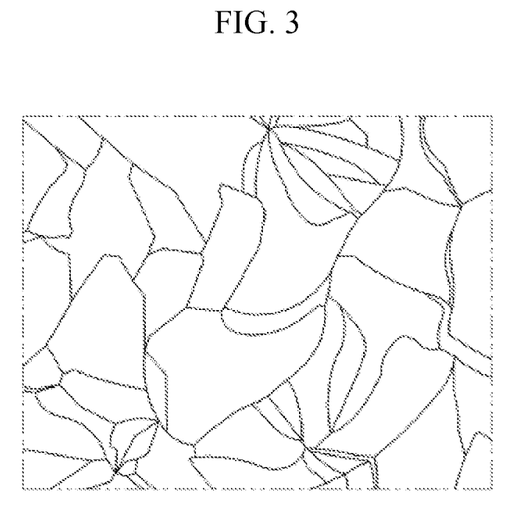
FIG. 3 is a cross-sectional view schematically showing the shape of fine pieces when any one of the first, the second and the third shielding sheet is divided into a plurality of fine pieces in the magnetic field shield sheet for wireless power transmission according to an embodiment of the present disclosure.

Meanwhile, when the magnetic field shielding sheet 120 according to the present disclosure may be applied to a case where at least one of the first shielding sheet 121, the second shielding sheet 122 and the third shielding sheet 123 are flaked and divided into a plurality of fine pieces, the plurality of fine pieces may include fine pieces having at least one side of curved shape rather than straight line-shape (refer to FIG. 3). The number of fine pieces having at least one side of curved shape may account for 50% or more, preferably 70% or more, of the total number of the plurality of fine pieces.

Further, the shielding sheet may include fine pieces having at least one side of curved shape at a predetermined ratio, thereby securing the flexibility of the shielding sheet itself.

Accordingly, even if the first shielding sheet 121, the second shielding sheet 122, and the third shielding sheet 123 constituting the magnetic field shielding sheet 120 are bent by an external force during using or transportation, the cracking or breaking of the fine pieces are prevented because the flexibility of the sheet itself is improved in advance. Thus, it is possible to always maintain the characteristics (for example, magnetic permeability) of the initial design value for each sheet.

On the other hand, the testing result of flexibility according to the ratio of the fine pieces having at least one side of curved shape with respect to the total number of the fine pieces constituting each sheet are shown in below Table 2.

That is, when the sheet is bent 100 times at an angle of 30-degree with respect to the horizontal plane, in case where the average number of fine pieces protruding by pressing the protective film 126 is 10 or more, the sheet is classified as defective, and in case where the average number of protruding fine pieces by pressing the protective film 126 is 10 or less, the sheet is classified as non-defective.

TABLE 2

The average number of fine pieces protruding by pressing the protective film when the sheet is bent 100 times at an angle of 30-degree angle with respect to the horizontal plane

| Ratio of fine pieces having at least one side of curved shape | 30% | 50% | 70% |
|---|---|---|---|
| Average number of fine pieces | 20 | 9 | 3 |
| Defective/Non-defective | X | ○ | ○ |

As can be seen in Table 2 above, if the number of fine pieces having at least one side of curved shape is account for 50% or less of the total number of the plurality of fine pieces constituting each sheet, the average number of fine pieces protruding by pressing the protective film 126 was 10 or more. If the number of fine piece having at least one side of curved shape is account for 50% or more of the total number of the plurality of fine pieces constituting each sheet, the average number of fine pieces protruding by pressing the protective film 126 was 10 or less.

When the sheet is bent 100 times at an angle of 30-degree with respect to the horizontal plane, the number of fine pieces protruding by pressing the protective film is small means that the flexibility of the sheet itself is improved. That is, the possibility of breaking of the fine pieces by bending may be lowered and the change of the initial characteristic of the sheet itself may be prevented.

When the second shielding sheet 122 disposed to surround the first shielding sheet 121 and the third shielding sheet 123 stacked to cover one surface of the first shielding sheet 121 and the second shielding sheet 122, relatively large amount of bending due to external force may be generated as compared with the first shielding sheet 121. The number of fine pieces having at least one side of curved shape may account for 70% or more of the total number of fine pieces constituting the second shielding sheet 122 and the third shielding sheet 123.

When the first shielding sheet 121, the second shielding sheet 122 and the third shielding sheet 123 are shredded to be divided into a plurality of fine pieces, the average diameter size of the fine pieces constituting the second shielding sheet 122 and the third shielding sheet 123 may be set to be larger than the average diameter size of the fine pieces constituting the first shielding sheet 121. Preferably, the average diameter size of the fine pieces constituting the second shielding sheet 122 and the third shielding sheet 123 is 1.2 to 2 times larger than the average diameter size of the fine pieces constituting the first shielding sheet 121. For example, the average diameter size of the fine pieces constituting the first shielding sheet 121 may be 1 to 4 mm, and the average diameter of the fine pieces constituting the second shielding sheet 122 and the third shielding sheet 123 may be 4 mm to 6 mm.

Here, the average diameter may refer to a volume average diameter measured by a laser diffraction diameter size distribution meter.

For example, when the first shielding sheet 121 is composed of a ribbon sheet including at least one of an amorphous alloy and a nanocrystalline alloy, and the second shielding sheet 122 and the third shielding sheet 123 are composed of a ferrite sheet, the average diameter of the ferrite pieces constituting the second shielding sheet 122 and the third shielding sheet 123 may be larger than the average diameter of the ribbon pieces constituting the first shielding sheet 121.

If the size of the ferrite piece becomes too large, for example, if the size of the ferrite piece is twice or more than the average diameter size of the ribbon piece constituting the first shielding sheet 121, the flexibility of the sheet itself may be lowered. This is because if the average diameter size of the ferrite piece is 1.2 times or less than the average diameter size of the ribbon piece constituting the first shielding sheet 121, the original function of the ferrite may not be sufficiently exhibited.

When the magnetic field shield sheet 120 and the wireless power receiving module 100 including the same according to the present disclosure are applied to the electronic device such as the portable terminal, the magnetic field shield sheet 120 and the wireless power receiving module 100 may be attached to a back cover of the portable terminal. When the portable terminal is integrally formed, the magnetic field shield sheet 120 and the wireless power receiving module 100 may be mounted in a form attached to the rear case of the portable terminal.

As described above, the present disclosure has been described with respect to particularly preferred embodiments. However, the present disclosure is not limited to the above embodiments, and it is possible for one who has an ordinary skill in the art to make various modifications and variations, without departing off the spirit of the present disclosure.

What is claimed is:

1. A magnetic field shielding sheet for wireless power transmission comprising;
   a first shielding sheet for shielding a magnetic field generated from a first wireless power transmission antenna operable in a magnetic induction method;
   a second shielding sheet for shielding a magnetic field generated from a second wireless power transmission antenna operable in a magnetic resonance method, the second shielding sheet including a receiving portion for receiving a thickness of the first shielding sheet; and
   a third shielding sheet which is stacked on the same surface of the first shielding sheet and the second shielding sheet to cover the first shielding sheet and the second shielding sheet, for shielding the magnetic field generated from the second wireless power transmission antenna, wherein the first shielding layer is located in the receiving portion of the second shielding sheet and that the third shielding layer is in contact with both the first and second shielding sheets, wherein when the first shielding sheet and the second shielding sheet are flaked to be composed of a plurality of fine pieces, and the average diameter of the fine pieces constituting the second shielding sheet is larger than the average diameter of the fine pieces constituting the first shielding sheet.

2. The magnetic field shielding sheet for wireless power transmission of claim 1, wherein the third shielding sheet is disposed to cover a boundary region of the first shielding sheet and the second shielding sheet.

3. The magnetic field shielding sheet for wireless power transmission of claim 1, wherein the first shielding sheet is a ribbon sheet including at least one of an amorphous alloy and a nanocrystalline alloy, and the second shielding sheet and third shielding sheet are a ferrite sheet.

4. The magnetic field shielding sheet for wireless power transmission of claim 3, wherein the first shielding sheet is multi-layered ribbon sheets including at least one of an amorphous alloy and a nanocrystalline alloy.

5. The magnetic field shielding sheet for wireless power transmission of claim 3, wherein the ferrite sheet is a Mn—Zn ferrite sheet or a Ni—Zn ferrite sheet.

6. The magnetic field shielding sheet for wireless power transmission of claim 3, wherein at least one of the first shielding sheet, the second shielding sheet and the third shielding sheet are flaked and divided into a plurality of fine pieces.

7. The magnetic field shielding sheet for wireless power transmission of claim 6, wherein the fine pieces have irregular shapes.

8. The magnetic field shielding sheet for wireless power transmission of claim 6, wherein the neighboring fine pieces are entirely or partially insulated from each other.

9. The magnetic field shielding sheet for wireless power transmission of claim 6, wherein the fine pieces includes fine pieces having at least one side of curved shape, that is not straight line-shape.

10. The magnetic field shielding sheet for wireless power transmission of claim 9, wherein the number of fine pieces having at least one side of curved shape is equal to or more than 50% or more of the number of the total fine pieces.

* * * * *